(12) United States Patent
Chen et al.

(10) Patent No.: US 11,848,146 B2
(45) Date of Patent: Dec. 19, 2023

(54) STACKED ELECTRONIC MODULE AND METHOD TO MAKE THE SAME

(71) Applicant: CYNTEC CO., LTD., Hsinchu (TW)

(72) Inventors: Da-Jung Chen, Taoyuan County (TW); Chien Ming Chen, Hsinchu County (TW)

(73) Assignee: CYNTEC CO., LTD., Hsinchu (TW)

( * ) Notice: Subject to any disclaimer, the term of this patent is extended or adjusted under 35 U.S.C. 154(b) by 393 days.

(21) Appl. No.: 17/317,902

(22) Filed: May 12, 2021

(65) Prior Publication Data

US 2022/0130585 A1   Apr. 28, 2022

Related U.S. Application Data

(60) Provisional application No. 63/104,530, filed on Oct. 23, 2020.

(51) Int. Cl.
| | |
|---|---|
| H01F 27/29 | (2006.01) |
| H01F 27/28 | (2006.01) |
| H01F 41/04 | (2006.01) |
| H01F 27/24 | (2006.01) |
| H01F 27/02 | (2006.01) |
| H01F 27/26 | (2006.01) |
| H01F 41/00 | (2006.01) |
| H01L 25/16 | (2023.01) |
| H01L 49/02 | (2006.01) |
| H01F 27/36 | (2006.01) |
| H01F 41/02 | (2006.01) |

(52) U.S. Cl.
CPC .......... *H01F 27/29* (2013.01); *H01F 27/022* (2013.01); *H01F 27/24* (2013.01); *H01F 27/266* (2013.01); *H01F 27/2804* (2013.01); *H01F 27/288* (2013.01); *H01F 27/2823* (2013.01); *H01F 27/363* (2020.08); *H01F 41/005* (2013.01); *H01F 41/02* (2013.01); *H01F 41/04* (2013.01); *H01L 25/16* (2013.01); *H01L 28/10* (2013.01)

(58) Field of Classification Search
CPC ...... H01F 27/29; H01F 27/363; H01F 27/022; H01F 27/24; H01F 27/266; H01F 27/2804; H01F 27/2823; H01F 27/288; H01F 41/005; H01F 41/02; H01F 41/04; H01L 25/16; H01L 28/10
USPC .......................................................... 361/761
See application file for complete search history.

(56) References Cited

U.S. PATENT DOCUMENTS

2015/0116950 A1*   4/2015  Yoo ..................... H01F 27/2804
                                                                    361/728

* cited by examiner

*Primary Examiner* — Binh B Tran
(74) *Attorney, Agent, or Firm* — Min-Lee Teng (57) ABSTRACT

A stacked electronic module includes a magnetic device comprising a magnetic body with electrodes of the magnetic device being disposed on a top and bottom surface of the magnetic body, wherein a molding body encapsulates the magnetic body, wherein conductive layers are disposed on a top and bottom surface of the molding body for electrically connected to the electrodes of the magnetic device.

20 Claims, 7 Drawing Sheets

FIG. 1D providing a magnetic device comprising a magnetic body, wherein at least one first electrode of the magnetic device is disposed on a top surface of the magnetic body and at least one second electrode of the magnetic device is disposed on a bottom surface of the magnetic body   S201 forming a molding body, the molding body comprising a first insulating material to encapsulate the magnetic body, wherein the at least one first electrode and the at least one second electrode are exposed from the molding body   S202 forming a second insulating layer on the top surface of the molding body to encapsulate the at least one first electrode, wherein a plurality of first conductive patterns are disposed over the second insulating layer and electrically connect with the at least one first electrode   S203 forming a third insulating layer on the bottom surface of the molding body to encapsulate the at least one second electrode, wherein a plurality of second conductive patterns are disposed over the third insulating layer and electrically connect with the at least one second electrode   S204

STACKED ELECTRONIC MODULE AND METHOD TO MAKE THE SAME

CROSS-REFERENCE TO RELATED APPLICATIONS

The present application claims the benefit of U.S. Provisional Application Ser. No. 63/104,530 filed on Oct. 23, 2020, the entirety of which is incorporated by reference herein.

BACKGROUND OF THE INVENTION

Field of the Invention

The invention relates to stacked electronic modules.

Description of the Related Art

Electronic structures, such as power modules and DC-DC converters, typically include electronic devices on a circuit board, having interconnecting circuitry, electrically connected to the circuit board such as a PCB. However, the PCB will increase the height of the module and the conduction paths between electronic devices.

Accordingly, there is demand for a better stacked electronic module to solve the aforementioned problems.

SUMMARY OF THE INVENTION

One objective of the present invention is to eliminate the need for outsourcing a PCB for effectively reducing the height of the module and shorten the conduction paths between electronic devices.

In one embodiment, a stacked electronic module is disclosed, wherein the stacked electronic module comprises: a magnetic device, comprising a magnetic body, wherein at least one first electrode of the magnetic device is disposed on a top surface of the magnetic body and at least one second electrode of the magnetic device is disposed on a bottom surface of the magnetic body; a molding body, comprising a first insulating material to encapsulate the magnetic body, wherein the at least one first electrode and the at least one second electrode are exposed from the molding body; a second insulating layer is disposed on the top surface of the molding body and encapsulates the at least one first electrode, wherein a plurality of first conductive patterns are disposed over the second insulating layer and electrically connect with the at least one first electrode; and a third insulating layer, disposed on the bottom surface of the molding body and encapsulates the at least one second electrode, wherein a plurality of second conductive patterns are disposed over the third insulating layer and electrically connect with the at least one second electrode.

In one embodiment, a third plurality of conductive patterns are disposed on at least one lateral surface of the magnetic device, wherein the plurality of second conductive patterns are electrically connected to the plurality of first conductive patterns through the third plurality of conductive patterns.

In one embodiment, the magnetic device comprises a choke, wherein a coil is disposed in the magnetic body for forming the choke, wherein the first electrode and the second electrode are electrically connected to the coil.

In one embodiment, the magnetic device is a choke, wherein a coil is disposed in the magnetic body for forming the choke, wherein the first electrode and the second electrode are electrically connected to the coil.

In one embodiment, a first coil and a second coil are disposed in the magnetic body, wherein a first plurality of electrodes are disposed on the top surface of the magnetic body, and a second plurality of electrodes are disposed on the bottom surface of the magnetic body.

In one embodiment, the coupling coefficient of the first coil and the second coil is zero.

In one embodiment, at least one first electronic device is disposed on a top surface of the molding body and electrically connected to the first electrode of the magnetic device, wherein the second insulating layer encapsulates the first electronic device.

In one embodiment, at least one second electronic device is disposed over the second insulating layer, wherein the second electronic device is electrically connected to the plurality of first conductive patterns.

In one embodiment, at least one first electronic device comprises an IC.

In one embodiment, at least one first electronic device comprises a flip chip IC.

In one embodiment, at least one first electronic device comprises an active electronic component.

In one embodiment, at least one first electronic device comprises a passive electronic component.

In one embodiment, at least one first electronic device comprises an active component and a passive electronic component.

In one embodiment, at least one second electronic device comprises an IC.

In one embodiment, at least one second electronic device comprises a flip chip IC.

In one embodiment, at least one second electronic device comprises an active electronic component.

In one embodiment, at least one second electronic device comprises a passive electronic component.

In one embodiment, at least one second electronic device comprises an active component and a passive electronic component.

In one embodiment, a method to from a stacked electronic module is disclosed, the method comprising: providing a magnetic device comprising a magnetic body, wherein at least one first electrode of the magnetic device is disposed on a top surface of the magnetic body and at least one second electrode of the magnetic device is disposed on a bottom surface of the magnetic body; forming a molding body, the molding body comprising a first insulating material to encapsulate the magnetic body, wherein the at least one first electrode and the at least one second electrode are exposed from the molding body; forming a second insulating layer on the top surface of the molding body to encapsulate the at least one first electrode, wherein a plurality of first conductive patterns are disposed over the second insulating layer and electrically connect with the at least one first electrode; and forming a third insulating layer on the bottom surface of the molding body to encapsulate the at least one second electrode, wherein a plurality of second conductive patterns are disposed over the third insulating layer and electrically connect with the at least one second electrode.

In one embodiment, a stacked electronic module is disclosed, the stacked electronic module comprising: a magnetic device, comprising a magnetic body, wherein at least one first electrode of the magnetic device is disposed on a top surface of the magnetic body and at least one second electrode of the magnetic device is disposed on a bottom surface of the magnetic body; a circuit board, the circuit board comprising at least one first insulating layer and a plurality of first conductive patterns separated by the at least one first insulating layer; a second insulating layer over a top surface of the molding body to encapsulate the at least one first electrode, wherein a plurality of second conductive patterns are disposed over the second insulating layer and electrically connect with the at least one first electrode; and a third insulating layer, disposed over the bottom surface of the molding body and encapsulates the at least one second electrode, wherein a plurality of third conductive patterns are disposed over the third insulating layer and electrically connect with the at least one second electrode.

In one embodiment, a method to from a stacked electronic module, the method comprising: providing a magnetic device comprising a magnetic body, wherein at least one first electrode of the magnetic device is disposed on a top surface of the magnetic body and at least one second electrode of the magnetic device is disposed on a bottom surface of the magnetic body; forming a circuit board, the circuit board comprising at least one first insulating layer and a plurality of first conductive patterns separated by the at least one first insulating layer; disposing the magnetic device in a through opening of the circuit board; forming a second insulating layer over a top surface of the molding body to encapsulate the at least one first electrode, wherein a plurality of second conductive patterns are disposed over the second insulating layer and electrically connect with the at least one first electrode; and forming a third insulating layer over the bottom surface of the molding body to encapsulate the at least one second electrode, wherein a plurality of third conductive patterns are disposed over the third insulating layer and electrically connect with the at least one second electrode.

BRIEF DESCRIPTION OF THE DRAWINGS

The present invention can be more fully understood by reading the subsequent description and examples with references made to the accompanying drawings, wherein.

DETAILED DESCRIPTION OF THE INVENTION

It is understood that the following disclosure provides many different embodiments, or examples, for implementing different features of the invention. Specific examples of devices and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features are formed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1A:
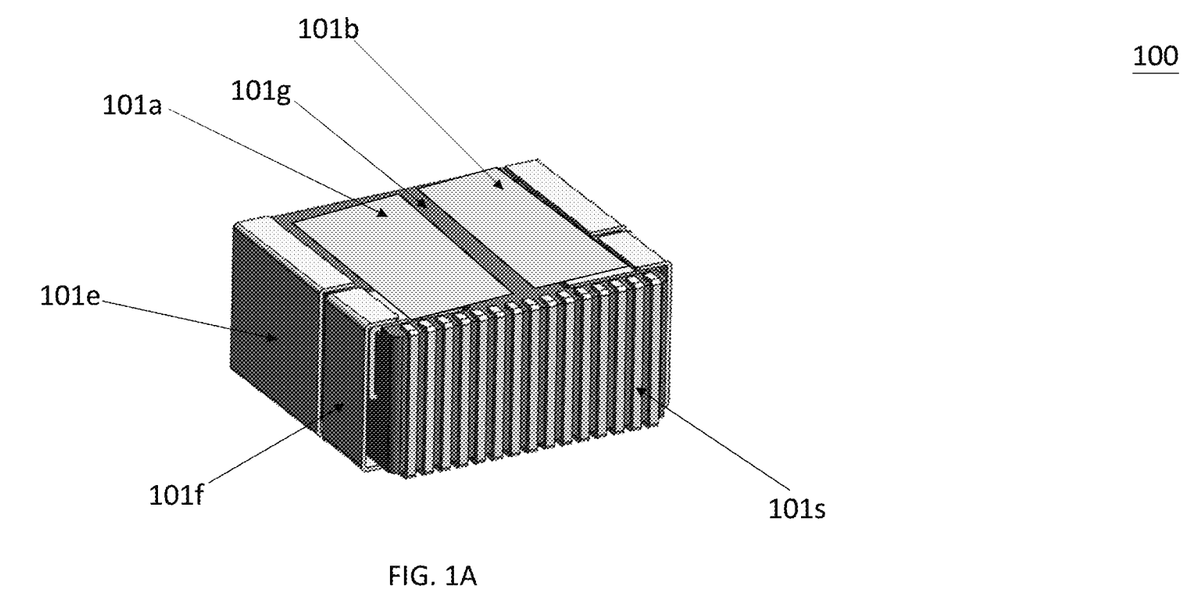
FIG. 1A is a top view of a stacked electronic module 100 in accordance with an embodiment of the invention.
Figure 1B:
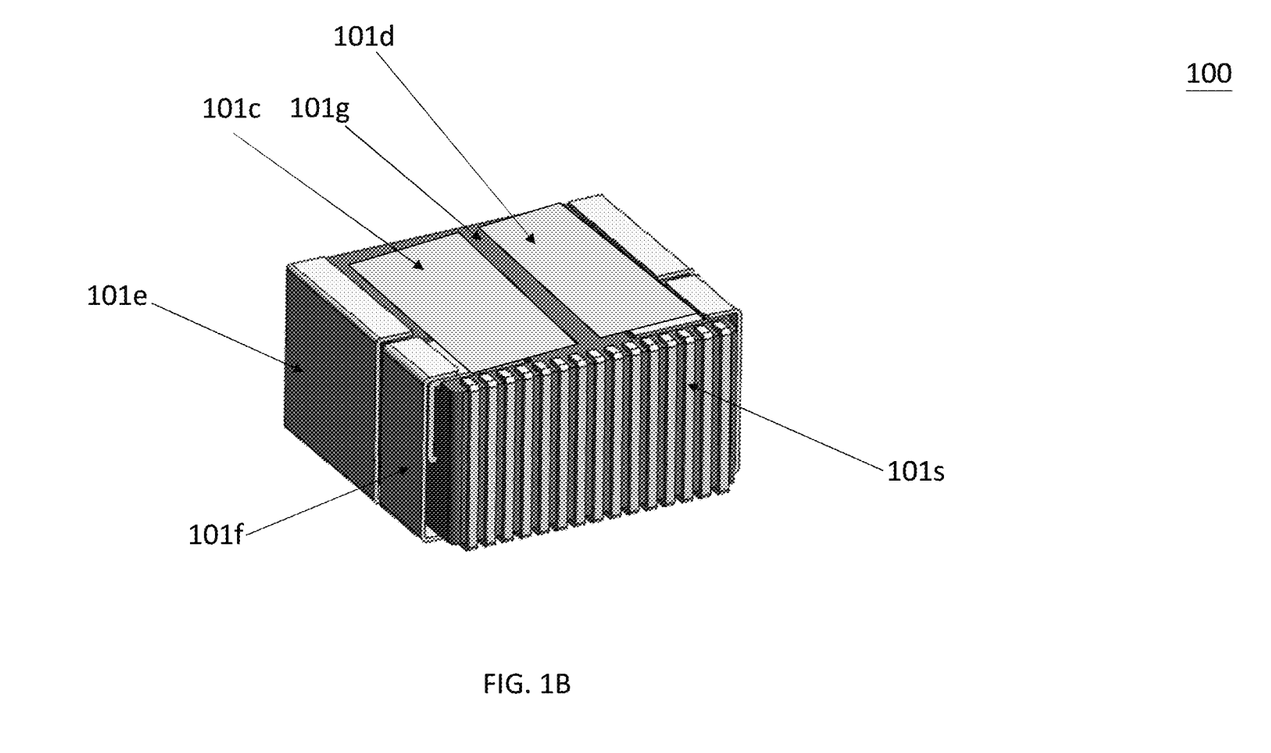
FIG. 1B is a bottom view of a stacked electronic module 100 in accordance with an embodiment of the invention.
Figure 1C:
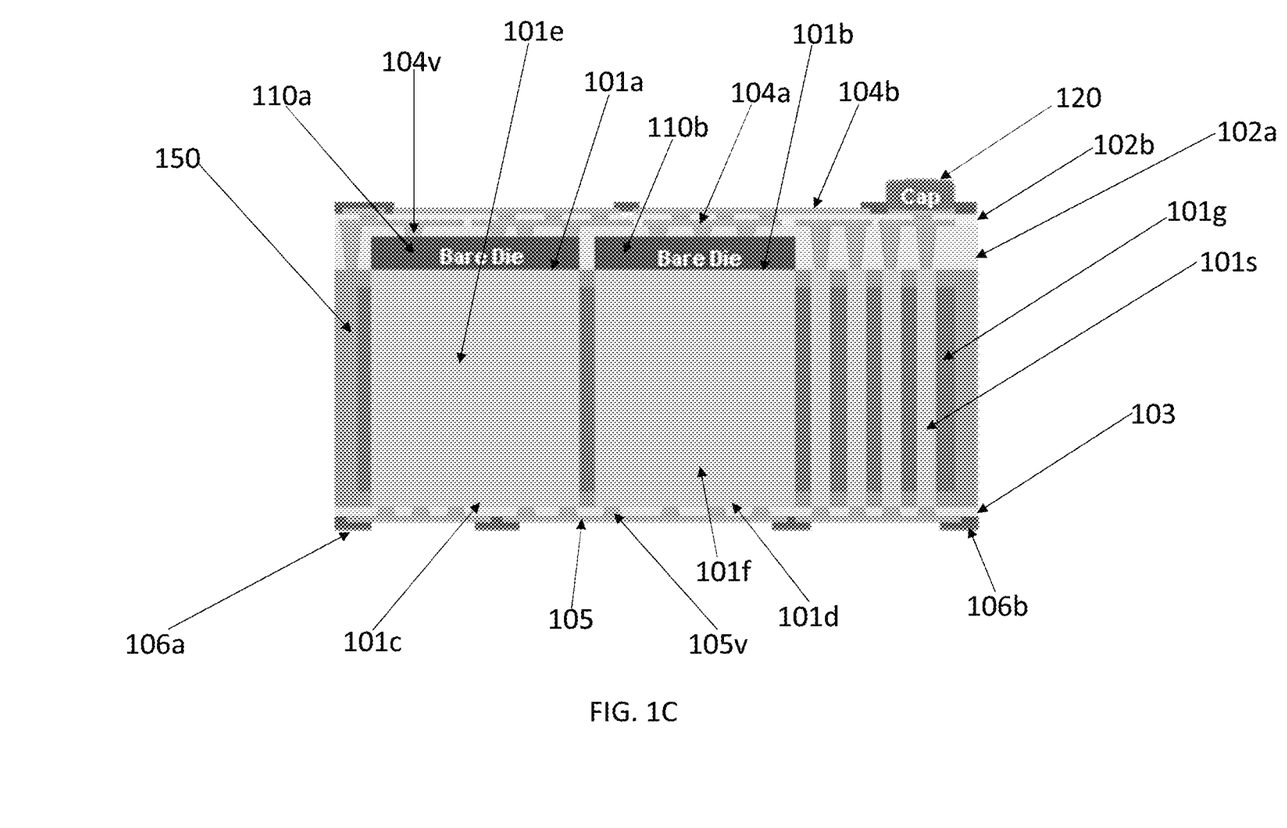
FIG. 1C is a side view of a stacked electronic module 100 in accordance with an embodiment of the invention.

FIG. 1A is a top view of a magnetic device 100, FIG. 1B is a bottom view of the magnetic device 100, and FIG. 1C is a side view of a stacked electronic module comprising the magnetic device 100 in accordance with an embodiment of the invention. Please refer to FIG. 1A, FIG. 1B and FIG. 1C, wherein the stacked electronic module 100 comprises: a magnetic device, comprising a magnetic body 101g, wherein at least one first electrode 101a, 101b of the magnetic device is disposed on a top surface of the magnetic body 101g, as shown in FIG. 1A and at least one second electrode 101c, 101d of the magnetic device is disposed on a bottom surface of the magnetic body 101g, as shown in FIG. 1B; a molding body 150 comprising a first insulating material to encapsulate the magnetic body 101g, as shown in FIG. 1C, wherein the at least one first electrode 101a, 101b and the at least one second electrode 101c, 101d are exposed from the molding body 150; a second insulating layer 102a is disposed on the top surface of the molding body 150 and encapsulates the at least one first electrode 101a, 101b, wherein a plurality of first conductive patterns 104a are disposed over the second insulating layer 102a and electrically connect with the at least one first electrode 101a, 101b; and a third insulating layer 103, disposed on the bottom surface of the molding body 150 and encapsulates the at least one second electrode 101c, 101d, wherein a plurality of second conductive patterns 105 are disposed over the third insulating layer 103 and electrically connect with the at least one second electrode 101c, 101d. In one embodiment, the molding body 150 comprises resin. In one embodiment, the molding body 150 comprises ABF (Ajinomoto Build-up Film). In one embodiment, the molding body 150 is made by ABF (Ajinomoto Build-up Film).

In one embodiment, a third plurality of conductive patterns 101e, 101f, 101s are disposed on at least one lateral surface of the magnetic device, wherein the plurality of second conductive patterns 105 are electrically connected to the plurality of first conductive patterns 104a through the third plurality of conductive patterns 101e, 101f, 101s.

In one embodiment, the magnetic device comprises a choke, wherein a coil is disposed in the magnetic body for forming the choke, wherein the first electrode and the second electrode are electrically connected to the coil.

In one embodiment, the magnetic device is a choke, wherein a coil is disposed in the magnetic body for forming the choke, wherein the first electrode and the second electrode are electrically connected to the coil.

In one embodiment, a first coil and a second coil are disposed in the magnetic body, wherein a first plurality of electrodes are disposed on the top surface of the magnetic body, and a second plurality of electrodes are disposed on the bottom surface of the magnetic body.

In one embodiment, the coupling coefficient of the first coil and the second coil is zero.

In one embodiment, as shown in FIG. 1C, at least one electronic device 110a, 110b is disposed on a top surface of the molding body 150 and electrically connected to said first electrode 101a, 101b of the magnetic device, wherein the second insulating layer 102a encapsulates the at least one electronic device 110a, 110b.

In one embodiment, as shown in FIG. 1C, the plurality of first conductive patterns 104a electrically connect with the at least one electronic device 110a, 110b through at least one via 104v.

In one embodiment, as shown in FIG. 1C, a plurality of electrodes 106a, 106b are disposed on the bottom surface of the magnetic device.

In one embodiment, as shown in FIG. 1C, each of the plurality of electrodes 106a, 106b is a surface-mounted PAD.

Figure 1D:
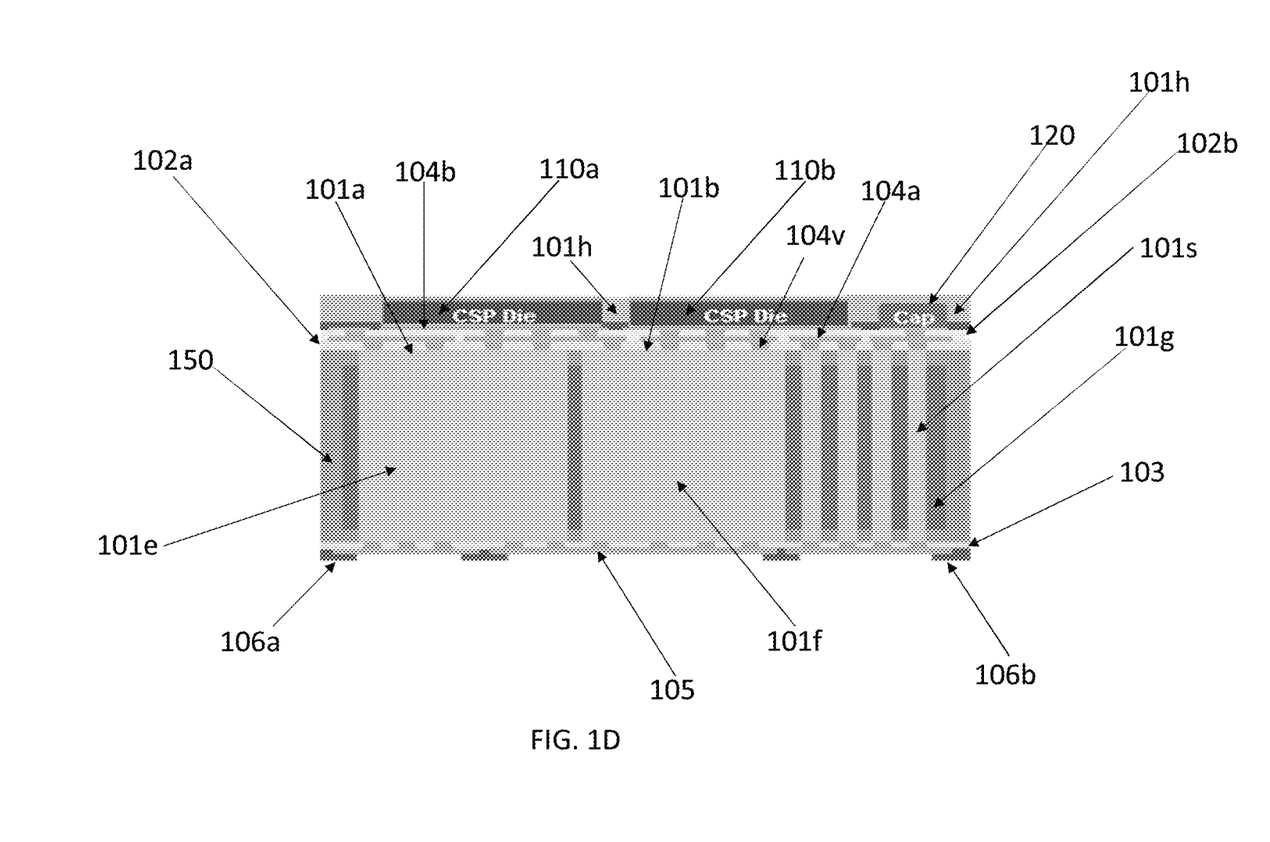
FIG. 1D is a side view of a stacked electronic module 100 in accordance with an embodiment of the invention.

FIG. 1D is a side view of a stacked electronic module 100 in accordance with an embodiment of the invention.

In one embodiment, as shown in FIG. 1D, at least one second electronic device 110a, 110b is disposed over the second insulating layer 102a, wherein the at least one electronic device 110a, 110b is electrically connected to the plurality of first conductive patterns 104a.

In one embodiment, as shown in FIG. 1D, the plurality of first conductive patterns 104a electrically connect with the at least one first electrode 101a, 101b through at least one via 104v.

In one embodiment, the at least one electronic device 110a, 110b comprises an IC.

In one embodiment, the at least one electronic device 110a, 110b comprises a passive electronic component.

In one embodiment, at least one second electronic device comprises a flip chip IC.

In one embodiment, at least one second electronic device comprises an active electronic component.

In one embodiment, at least one second electronic device comprises a passive electronic component.

In one embodiment, at least one second electronic device comprises an active component and a passive electronic component.

In one embodiment, as shown in FIG. 1D, a second molding body 101h is disposed over the plurality of first conductive patterns 104a and the second insulating layer 102a to encapsulate the at least one second electronic device 110a, 110b.

In one embodiment, a heatsink is disposed over the at least one second electronic device 110a, 110b for dissipating heat.

In one embodiment, the at least one second electronic device 110a, 110b comprises a flip chip, wherein a heatsink is disposed on the flip chip for dissipating heat.

Figure 2:
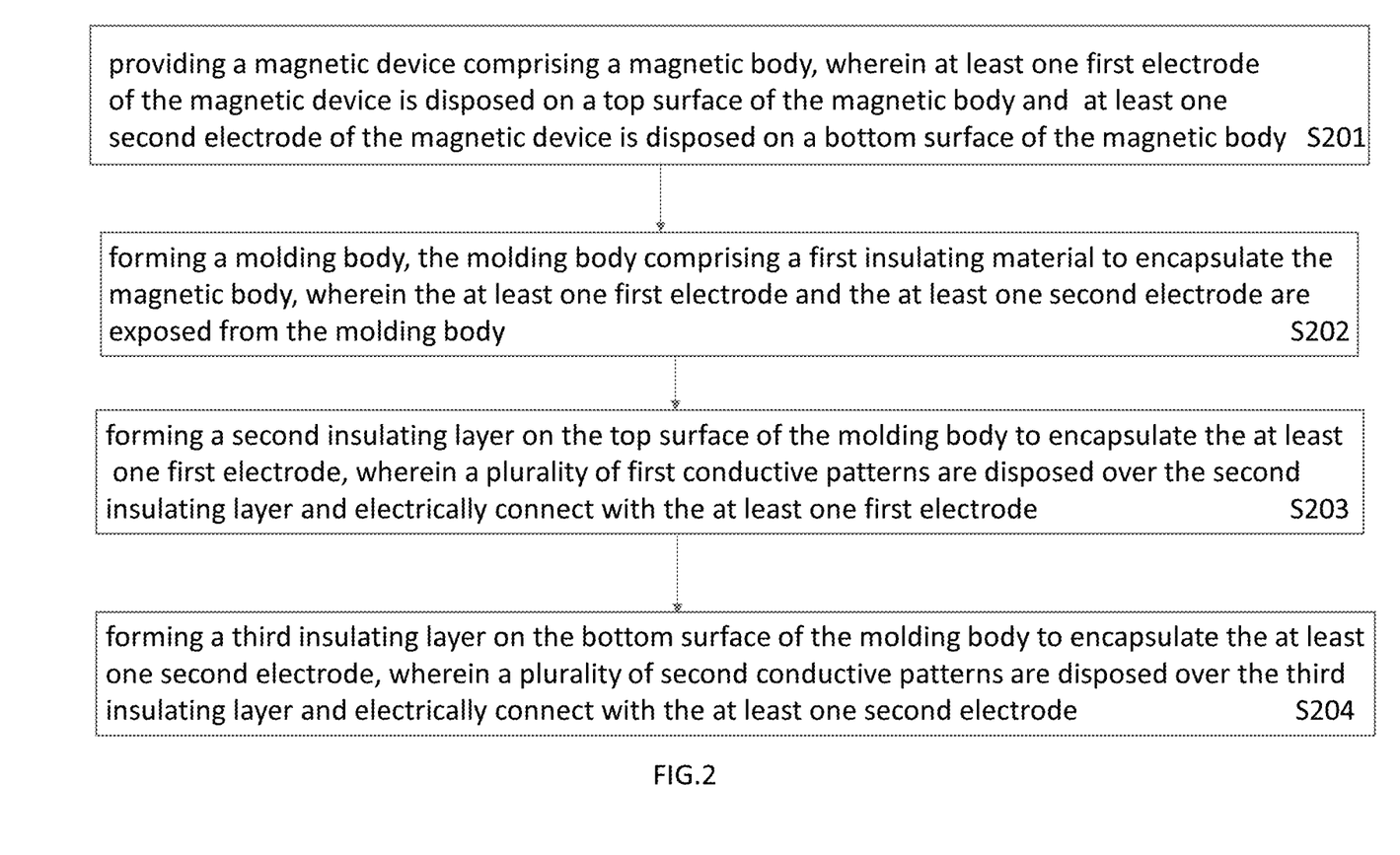
FIG. 2 is a flowchart to form a stacked electronic module in accordance an embodiment of the invention.

In one embodiment, as shown in FIG. 2, a method to from a stacked electronic module is disclosed, the method comprising: (S201) providing a magnetic device comprising a magnetic body, wherein at least one first electrode of the magnetic device is disposed on a top surface of the magnetic body and at least one second electrode of the magnetic device is disposed on a bottom surface of the magnetic body; (S202) forming a molding body, the molding body comprising a first insulating material to encapsulate the magnetic body, wherein the at least one first electrode and the at least one second electrode are exposed from the molding body; (S203) forming a second insulating layer on the top surface of the molding body to encapsulate the at least one first electrode, wherein a plurality of first conductive patterns are disposed over the second insulating layer and electrically connect with the at least one first electrode; and (S204) forming a third insulating layer on the bottom surface of the molding body to encapsulate the at least one second electrode, wherein a plurality of second conductive patterns are disposed over the third insulating layer and electrically connect with the at least one second electrode.

Figure 3:
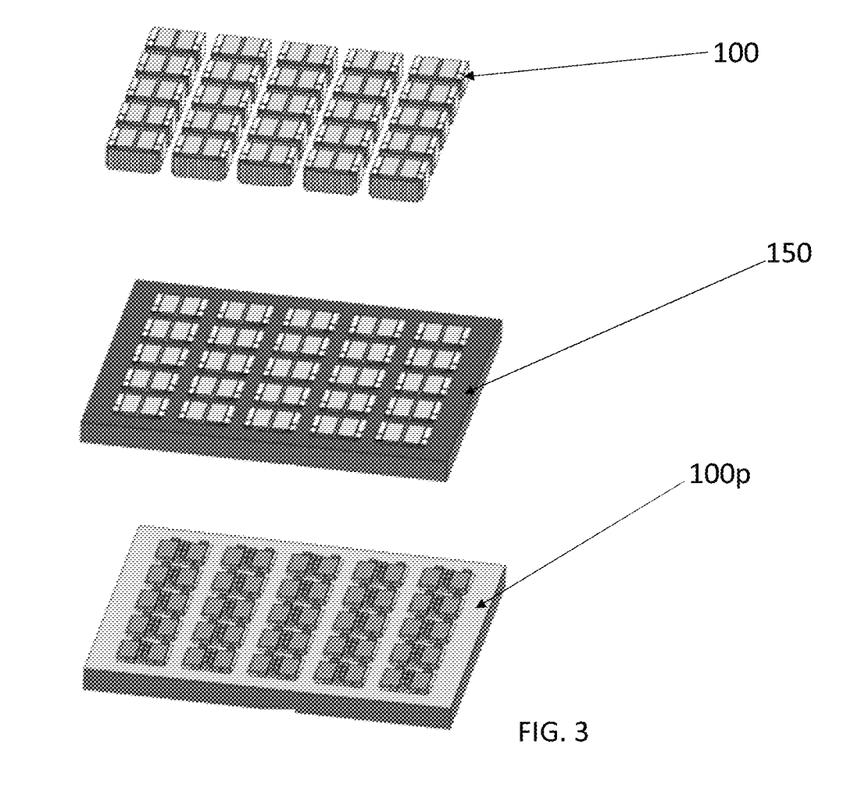
FIG. 3 is a flowchart to form a plurality of stacked electronic modules in accordance with an embodiment of the invention.

In one embodiment, as shown in FIG. 3, a method to from a stacked electronic module, the method comprising: (S301) providing a plurality of magnetic device each comprising a magnetic body, wherein at least one first electrode of each magnetic device is disposed on a top surface of a corresponding magnetic body of the magnetic device and at least one second electrode of the magnetic device is disposed on a bottom surface of the magnetic body; (S302) forming a molding body, the molding body comprising a first insulating material to encapsulate the plurality of the magnetic device, wherein the at least one first electrode and the at least one second electrode are exposed from the molding body; (S303) forming a second insulating layer on the top surface of the molding body to encapsulate the at least one first electrode, wherein a plurality of first conductive patterns are disposed over the second insulating layer and electrically connect with the at least one first electrode; and forming a third insulating layer on the bottom surface of the molding body to encapsulate the at least one second electrode, wherein a plurality of second conductive patterns are disposed over the third insulating layer and electrically connect with the at least one second electrode, wherein the molding body is cut into pieces with each piece being a separated magnetic device.

Figure 4A:
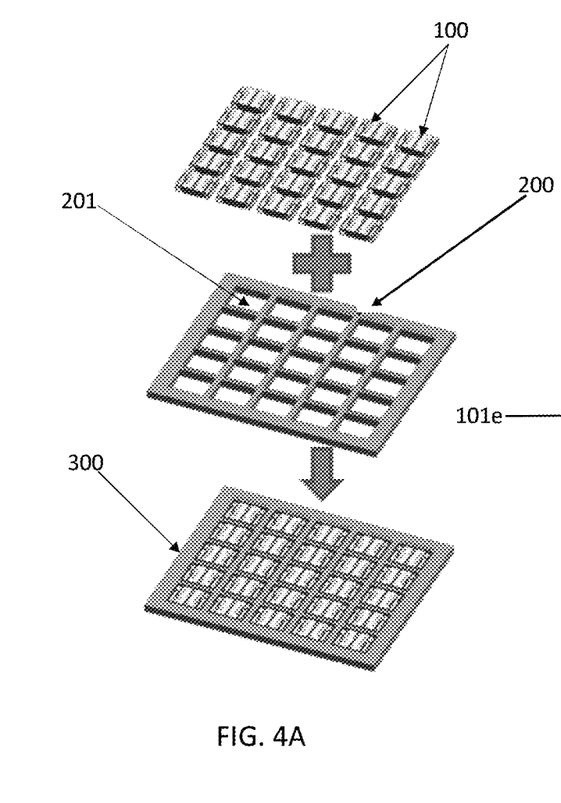
FIG. 4A is an exploded view for forming a stacked electronic module in accordance with an embodiment of the invention.

FIG. 4A is an exploded view for forming a stacked electronic module in accordance with an embodiment of the invention, wherein a plurality of magnetic devices 100 each comprising a magnetic body, wherein at least one first electrode of a magnetic device 100 is disposed on a top surface of the magnetic body and at least one second electrode of the magnetic device 100 is disposed on a bottom surface of the magnetic body; forming a circuit board 200, the circuit board 100 comprising at least one first insulating layer and a plurality of first conductive patterns separated by the at least one first insulating layer, wherein a plurality of through openings 201 are formed in the circuit board; disposing each of the plurality of magnetic devices 100 in a corresponding through opening 201 of the circuit board 200; forming a second insulating layer over the plurality of magnetic devices 100 and the circuit board 200 to form a laminated structure 300 for fixing the magnetic devices 100 in the circuit board 200. In one embodiment, the second insulating layer comprises ABF (Ajinomoto Build-up Film). In one embodiment, the second insulating layer is formed by ABF (Ajinomoto Build-up Film).

Figure 4B:
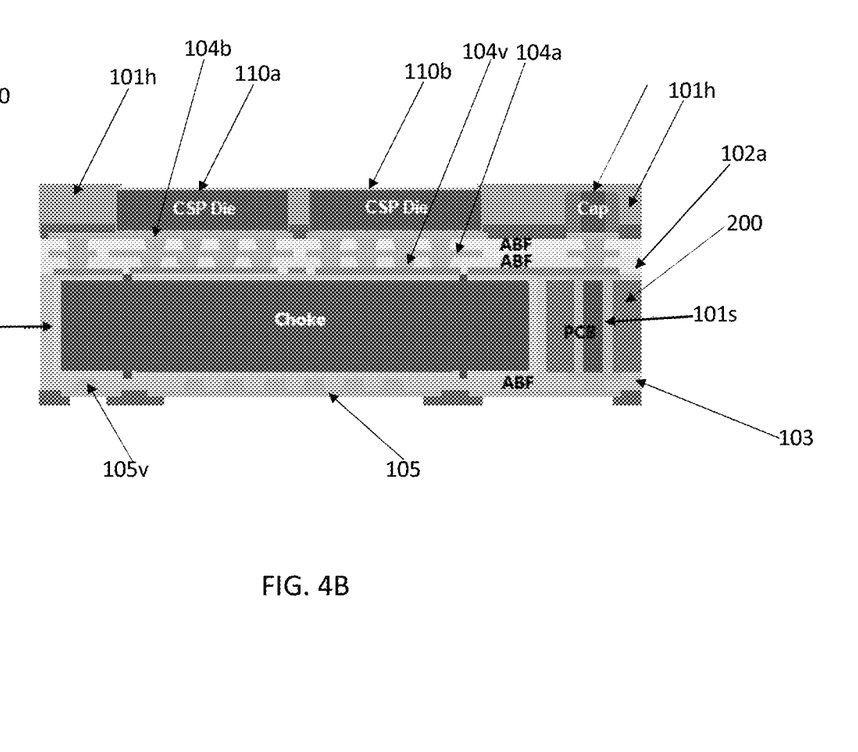
FIG. 4B is a side view of a stacked electronic module in accordance with an embodiment of the invention

FIG. 4B is a side view of a stacked electronic module comprising the magnetic device 100 of FIG. 1A and FIG. 1B in accordance with an embodiment of the invention. Please refer to FIG. 1A, FIG. 1B and FIG. 4B, wherein the stacked electronic module comprises: a magnetic device 100, comprising a magnetic body 101g, wherein at least one first electrode 101a, 101b of the magnetic device 100 is disposed on a top surface of the magnetic body 101g and at least one second electrode 101c, 101d of the magnetic device 100 is disposed on a bottom surface of the magnetic body 101g; a circuit board 200, the circuit board 200 comprising at least one first insulating layer and a plurality of first conductive patterns 101s; a second insulating layer 102a over a top surface of the molding body 101g to encapsulate the at least one first electrode 101a, 101b, wherein a plurality of second conductive patterns 104a, 104b are disposed over the second insulating layer 102a and electrically connect with the at least one first electrode 101a, 101b; and a third insulating layer 103, disposed over the bottom surface of the molding body 101g and encapsulates the at least one second electrode

101c, 101d, wherein a plurality of third conductive patterns 105 are disposed over the third insulating layer 103 and electrically connect with the at least one second electrode 101c, 101d. In one embodiment, the second insulating layer comprises ABF (Ajinomoto Build-up Film). In one embodiment, each of the second and the third insulating layer comprises ABF. In one embodiment, the second insulating layer is formed by ABF (Ajinomoto Build-up Film). In one embodiment, each of the second and the third insulating layer is formed by ABF.

The main advantages of the present invention are described as follows: 1. the choke can be embedded in the RDL (Redistribution Layer) on the surface of the choke to effectively reduce the foot print; 2. the insulating layer and circuit layers are made on the choke so as to eliminate the need for outsourcing PCB, which can effectively reduce the height of the module and shorten the conduction paths between electronic devices; 3. flip chip IC has extremely small upward thermal resistance, and a heatsink can be disposed on the flip chip IC to effectively dissipate the heat of the module.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

What is claimed is:

1. A stacked electronic module, comprising:
   a magnetic device, comprising a magnetic body, wherein at least one first electrode of the magnetic device is disposed over a top surface of the magnetic body and at least one second electrode of the magnetic device is disposed over a bottom surface of the magnetic body;
   a molding body, comprising a first insulating material to encapsulate the magnetic body, wherein the at least one first electrode and the at least one second electrode are exposed from the molding body;
   a second insulating layer is disposed over the top surface of the molding body and encapsulates the at least one first electrode, wherein a plurality of first conductive patterns are disposed over the second insulating layer and electrically connect with the at least one first electrode; and
   a third insulating layer, disposed over the bottom surface of the molding body and encapsulates the at least one second electrode, wherein a plurality of second conductive patterns are disposed over the third insulating layer and electrically connect with the at least one second electrode.

2. The stacked electronic module as claimed in claim 1, wherein a third plurality of conductive patterns are disposed on at least one lateral surface of the magnetic device, wherein the plurality of second conductive patterns are electrically connected to the plurality of first conductive patterns through the third plurality of conductive patterns.

3. The stacked electronic module as claimed in claim 1, wherein the magnetic device comprises a coil disposed in the magnetic body, wherein the first electrode and the second electrode are electrically connected to the coil.

4. The stacked electronic module as claimed in claim 1, wherein the magnetic device is a choke, wherein a coil is disposed in the magnetic body for forming the choke, wherein the first electrode and the second electrode are electrically connected to the coil.

5. The stacked electronic module as claimed in claim 1, wherein a first coil and a second coil are disposed in the magnetic body, wherein the at least one first electrode and the at least one second electrode are electrically connected to the first coil and the second coil, respectively.

6. The stacked electronic module as claimed in claim 4, wherein the molding body comprises ABF.

7. The stacked electronic module as claimed in claim 1, further comprising an electronic device disposed on a top surface of the molding body and electrically connected to said first electrode of the magnetic device, wherein the second insulating layer encapsulates the electronic device.

8. The stacked electronic module as claimed in claim 1, further comprising an electronic device disposed over the second insulating layer, wherein the electronic device is electrically connected to the plurality of first conductive patterns.

9. The stacked electronic module as claimed in claim 1, wherein the magnetic device is disposed in a through opening of a circuit board, wherein the molding body comprises ABF that is disposed on the magnetic device and the circuit board.

10. The stacked electronic module as claimed in claim 1, further comprising an active device and a passive device disposed over the second insulating layer, wherein the an active device and the passive device are electrically connected to the plurality of first conductive patterns.

11. A method to from a stacked electronic module, the method comprising:
    providing a magnetic device comprising a magnetic body, wherein at least one first electrode of the magnetic device is disposed over a top surface of the magnetic body and at least one second electrode of the magnetic device is disposed over a bottom surface of the magnetic body;
    forming a molding body, the molding body comprising a first insulating material to encapsulate the magnetic body, wherein the at least one first electrode and the at least one second electrode are exposed from the molding body;
    forming a second insulating layer on the top surface of the molding body to encapsulate the at least one first electrode, wherein a plurality of first conductive patterns are disposed over the second insulating layer and electrically connect with the at least one first electrode; and
    forming a third insulating layer on the bottom surface of the molding body to encapsulate the at least one second electrode, wherein a plurality of second conductive patterns are disposed over the third insulating layer and electrically connect with the at least one second electrode.

12. The method as claimed in claim 11, wherein a third plurality of conductive patterns are disposed on at least one lateral surface of the magnetic device, wherein the plurality of second conductive patterns are electrically connected to the plurality of first conductive patterns through the third plurality of conductive patterns.

13. The method as claimed in claim 11, wherein the magnetic device comprises a choke, wherein a coil is disposed in the magnetic body for forming the choke, wherein the first electrode and the second electrode are electrically connected to the coil.

14. The method as claimed in claim 11, wherein the magnetic device is a choke, wherein a coil is disposed in the magnetic body for forming the choke, wherein the first electrode and the second electrode are electrically connected to the coil.

15. The method as claimed in claim 11, wherein a first coil and a second coil are disposed in the magnetic body, wherein a first plurality of electrodes are disposed on the top surface of the magnetic body, and a second plurality of electrodes are disposed on the bottom surface of the magnetic body.

16. The method as claimed in claim 14, wherein the coupling coefficient of the first coil and the second coil is zero.

17. The method as claimed in claim 11, further comprising an electronic device disposed on a top surface of the molding body and electrically connected to said first electrode of the magnetic device, wherein the second insulating layer encapsulates the electronic device.

18. The method as claimed in claim 11, further comprising an electronic device disposed over the second insulating layer, wherein the electronic device is electrically connected to the plurality of first conductive patterns.

19. The method as claimed in claim 11, wherein said first electronic device is an IC.

20. The method as claimed in claim 11, wherein an active device and a passive device are disposed over the second insulating layer, wherein the an active device and the passive device are electrically connected to the plurality of first conductive patterns.

* * * * *